US012577658B2

(12) United States Patent
Lei

(10) Patent No.: US 12,577,658 B2
(45) Date of Patent: Mar. 17, 2026

(54) METHODS AND APPARATUS FOR TUNGSTEN GAP FILL

(71) Applicant: Applied Materials, Inc., Santa Clara, CA (US)

(72) Inventor: Wei Lei, Campbell, CA (US)

(73) Assignee: Applied Materials Inc., Santa Clara, CA (US)

( * ) Notice: Subject to any disclaimer, the term of this patent is extended or adjusted under 35 U.S.C. 154(b) by 63 days.

(21) Appl. No.: 17/811,582

(22) Filed: Jul. 9, 2022

(65) Prior Publication Data

US 2023/0134230 A1 May 4, 2023

Related U.S. Application Data

(60) Provisional application No. 63/274,328, filed on Nov. 1, 2021.

(51) Int. Cl.
| | |
|---|---|
| *C23C 16/02* | (2006.01) |
| *C23C 16/08* | (2006.01) |
| *C23C 16/34* | (2006.01) |
| *C23C 16/40* | (2006.01) |

(52) U.S. Cl.
CPC .......... *C23C 16/08* (2013.01); *C23C 16/0227* (2013.01); *C23C 16/0281* (2013.01); *C23C 16/34* (2013.01); *C23C 16/402* (2013.01)

(58) Field of Classification Search
None
See application file for complete search history.

(56) References Cited

U.S. PATENT DOCUMENTS

| | | | |
|---|---|---|---|
| 5,600,182 A * | 2/1997 | Schinella .......... | H01L 23/53223 |
| | | | 257/750 |
| 2003/0153181 A1* | 8/2003 | Yoon ................. | C23C 16/45525 |
| | | | 257/E21.585 |
| 2005/0208763 A1* | 9/2005 | Byun ................ | H01L 21/76876 |
| | | | 438/653 |
| 2009/0321943 A1* | 12/2009 | Meldrim .......... | H01L 21/28556 |
| | | | 257/E29.139 |
| 2012/0015518 A1 | 1/2012 | Chandrashekar et al. | |
| 2015/0031195 A1* | 1/2015 | Kim .................... | H01L 29/4236 |
| | | | 438/589 |
| 2015/0255333 A1* | 9/2015 | Lu ..................... | H01L 21/76864 |
| | | | 438/653 |
| 2020/0040448 A1 | 2/2020 | Wu et al. | |

OTHER PUBLICATIONS

PCT International Search Report and Written Opinion for PCT/US2022/036674 dated Nov. 7, 2022.

* cited by examiner

*Primary Examiner* — David P Turocy
(74) *Attorney, Agent, or Firm* — Moser Taboada

(57) ABSTRACT

Methods for forming tungsten gap fill on a feature. A method for forming tungsten gap fill in a feature can include: treating a first layer on a substrate having a portion of the first layer exposed through the feature; depositing a tungsten liner layer atop the treated portion of the first layer in the feature using a physical vapor deposition (PVD) process; and depositing a tungsten fill layer into the feature and atop the tungsten liner layer using a chemical vapor deposition (CVD) process.

5 Claims, 3 Drawing Sheets

METHODS AND APPARATUS FOR TUNGSTEN GAP FILL

CROSS-REFERENCE TO RELATED APPLICATIONS

This application claims benefit of U.S. provisional patent application Ser. No. 63/274,328, filed Nov. 1, 2021, which is herein incorporated by reference in its entirety.

FIELD

Embodiments of the present principles generally relate to processing of semiconductor substrates.

BACKGROUND

Tungsten is used in the semiconductor industry as a low resistivity conductor with minimal electro-migration. Tungsten may be used to fill holes as contacts for transistors and in the formation of vias between layers of integrated devices. Tungsten may also be used for interconnects in logic and memory devices due to tungsten's stability and low resistivity. As technology progresses, a demand is created for even lower resistivity and lower stress metal fill solutions. Accordingly, the inventor has provided improved tungsten gap fill processes.

SUMMARY

Methods and apparatus for tungsten gap fill are provided herein. In some embodiments, a tungsten gap fill process is provided using CVD W fill over a PVD W liner in a via contact to a metal gate layer is provided herein. In some embodiments, a pre-deposition surface treatment is provided to modify PVD W liner property on certain substrates and promote CVD W growth on PVD W liner accordingly. Embodiments of the present disclosure enable PVD W/CVD W fill approach for applications which use certain materials at the structure bottom (such as TiN, TiN/fluorine-free tungsten (FFW)). Embodiments of the present disclosure advantageously improve contact resistance (Rc) by reducing PVD W liner resistivity. Embodiments of the present disclosure further advantageously improve gapfill performance by reducing CVD W incubation delay from bottom PVD W, thus reducing or eliminating voids.

In some embodiments, a method for forming tungsten gap fill in a feature can include: treating a first layer on a substrate having a portion of the first layer exposed through the feature; depositing a tungsten liner layer atop the treated portion of the first layer in the feature using a physical vapor deposition (PVD) process; and depositing a tungsten fill layer into the feature and atop the tungsten liner layer using a chemical vapor deposition (CVD) process.

In some embodiments, a method for forming tungsten gap fill in a feature, includes: treating a first layer on a substrate exposed through a feature formed through a second layer disposed atop the first layer, wherein the first layer is a metal gate layer, wherein the second layer is an insulating layer, and wherein the treatment is one of a $B_2H_6 \rightarrow WF_6$ nucleation process or a CCTBA soak process; depositing a tungsten liner layer in the feature using a physical vapor deposition (PVD) process; and depositing a tungsten fill layer into the feature and atop the tungsten liner layer using a chemical vapor deposition (CVD) process. In some embodiments, the first layer is a TiN layer and the second layer is an $SiO_2$ layer.

In some embodiments, a non-transitory computer readable medium is provided. The non-transitory computer readable medium having instructions stored thereon that, when executed, cause a method for forming tungsten gap fill in a feature to be performed. The method can be as described in any of the embodiments disclosed herein.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
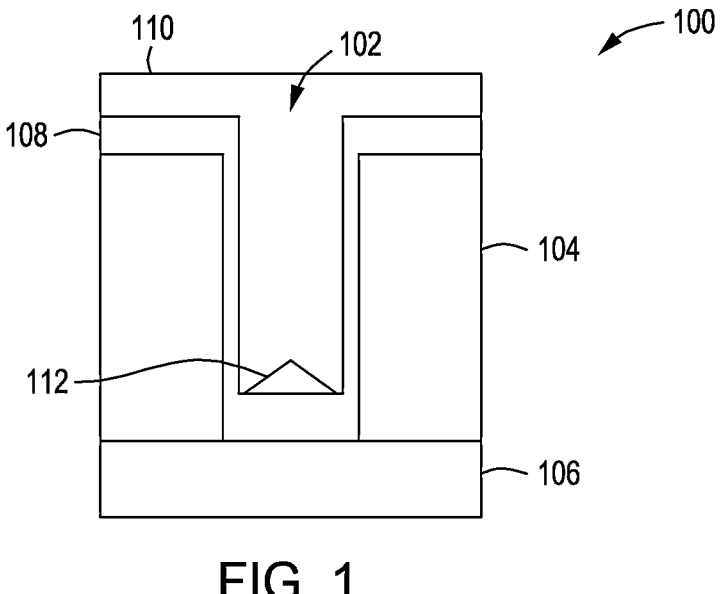
FIG. 1 depicts a cross-sectional view of a tungsten gap fill in a structure on a substrate.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for tungsten gap fill are provided herein. In some embodiments, a tungsten gap fill process is provided using CVD W fill over a PVD W liner in a via contact to a metal gate layer is provided herein. In some embodiments, a pre-deposition surface treatment is provided to modify PVD W liner property on certain substrates and promote CVD W growth on PVD W liner accordingly. Embodiments of the present disclosure enable PVD W/CVD W fill approach for applications which use certain materials at the structure bottom (such as TiN, TiN/fluorine-free tungsten (FFW)). Embodiments of the present disclosure advantageously improve contact resistance (Rc) by reducing PVD W liner resistivity. Embodiments of the present disclosure further advantageously improve gapfill performance by reducing CVD W incubation delay from bottom PVD W, thus reducing or eliminating voids. The methods and apparatus advantageously provide a low resistivity tungsten gap fill. The present disclosure may be used to fill structures such as vias or trenches and the like.

The inventor has observed high contact resistance in a structure (such as a via, for example a via contact to a metal gate) when a titanium (Ti) and/or titanium nitride (TiN) liner is used in the structure with a CVD tungsten (W) fill (with a nucleation layer), as compared to using a PVD W liner. However, the inventor has further observed that even when using a PVD W liner in the structure with a CVD W fill, in come cases, the resultant fill can undesirably include voids.

For example, FIG. 1 depicts a cross-sectional view of a substrate 100 having a tungsten gap fill in a feature 102 in the substrate 100. The feature 102 may be a via, trench, dual damascene, or other suitable structure formed on the substrate 100. The substrate 100 includes a metal gate layer 106, for example formed of TiN, and an insulating layer 104, for example formed of $SiO_2$, disposed atop the metal gate layer 106. For example, the feature 102 can be a via contact structure formed through the insulating layer 104 and exposing a portion of the underlying metal gate layer 106. A PVD W layer 108 is disposed atop the substrate 100, including atop the field region of the insulating layer 104 and atop an exposed portion of the metal gate layer 106 (e.g., exposed at a bottom of the feature 102). A CVD W layer 110 is disposed atop the PVD W layer 108. In some embodiments, the inventor has observed a void 112 disposed at the bottom of the feature 102, at the interface of the PVD W layer 108 and the CVD W layer 110. The inventor has observed that the void is due to the impact of the microstructure of the PVD W layer 108.

Figure 2:
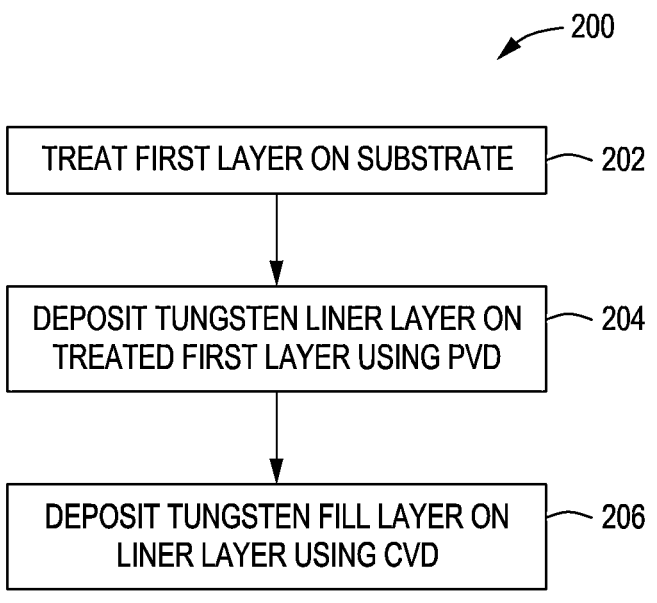
FIG. 2 is a method of filling gaps on a substrate in accordance with some embodiments of the present disclosure.
Figure 3A:
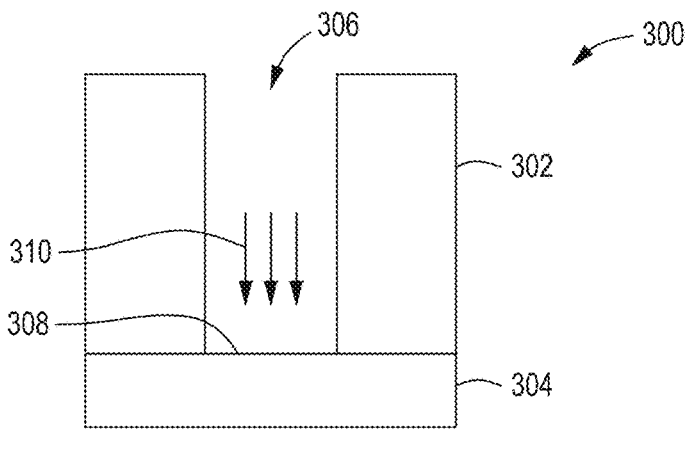
FIGS. 3A-3C respectively depict cross-sectional views of structure being gap filled in accordance with some embodiments of the present disclosure.
Figure 3B:
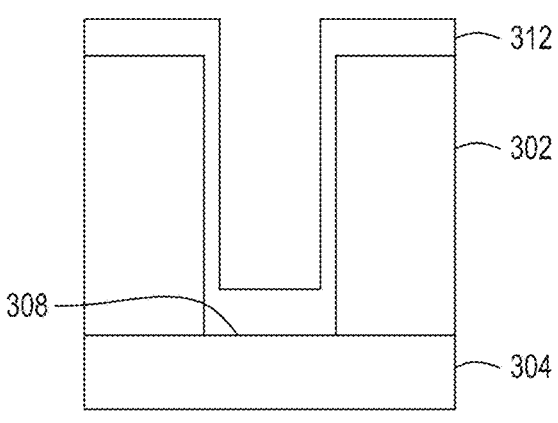
Figure 3C:
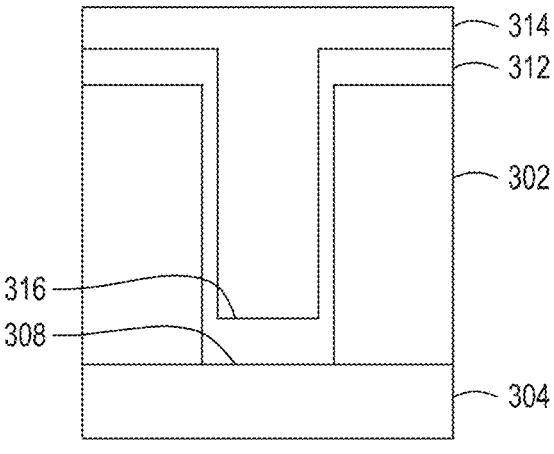

FIG. 2 is a method 200 of filling gaps on a substrate in accordance with some embodiments. FIGS. 3A-3C respectively depict cross-sectional views of a substrate being gap filled in accordance with the method 200. In block 202, a first layer on the substrate is treated. For example and as depicted in FIG. 3A, a substrate 300 is provided having a first layer 304 and a second layer 302 disposed atop the first layer 304. A feature 306 is formed through the second layer 302 to expose a portion 308 of the first layer 304. In some embodiments, the first layer 304 can be a metal gate layer, such as a TiN layer, the second layer 302 can be an insulating layer, such as a $SiO_2$ layer, and the feature 306 can be a trench or via or the like. The exposed portion 308 is treated, as indicated by arrows 310, to modify the PVD W microstructure. Examples of suitable treatment of the exposed portion 308 include a diborane ($B_2H_6$)→tungsten hexafluoride ($WF_6$) nucleation process or a tert-butylacetylene (dicobalt hexacarbonyl) (CCTBA) soak.

In some embodiments, an illustrative a $B_2H_6$→$WF_6$ nucleation process can be performed by alternately exposing the substrate to $B_2H_6$ and $WF_6$. For example, in some embodiments, $B_2H_6$ may be provided at a flow rate of about 50 sccm to 400 sccm. The $B_2H_6$ may be provided for a dose time of about 0.5 to 2 seconds. Subsequently, $WF_6$ can be provided at a flow rate of about 100 to 400 sccm. The $WF_6$ can be provided for a dose time of about 0.5 to 2 seconds. A flow of a purge gas may be provided between provision of the $B_2H_6$ and $WF_6$. For example, an inert gas, such as argon, may be provided at a flow rate and for a time sufficient to purge the chamber of the prior provided gas. In some embodiments, argon may be provided for about two seconds to purge the chamber. In some embodiments, the substrate can be maintained at a temperature of about 300 to 400 degrees Celsius while exposing the substrate to $B_2H_6$ and $WF_6$ during the nucleation process. In some embodiments, the nucleation process can be performed at a chamber pressure of about 1 to 40 Torr.

In some embodiments, an illustrative CCTBA soak can be performed by providing CCTBA in a carrier gas while maintaining the substrate at a temperature of about 175 to 225 degrees Celsius at a chamber pressure of about 1 to 50 Torr. In some embodiments, CCTBA may be carried to the process chamber in an inert carrier gas, such as argon. In some embodiments, the carrier gas can be provided at a flow rate of about 200 to 600 sccm. In some embodiments, there can be about 1 to 10 atomic percent of CCTBA in the carrier gas. In some embodiments, the CCTBA soak can be performed for about 5 to 30 seconds.

Next, at block 204 and as depicted in FIG. 3B, a PVD W liner layer 312 is deposited atop the treated exposed portion 308 of the first layer 304 as well as atop the second layer 302. The PVD W liner layer 312 can be deposited using known techniques for PVD deposition of W. In some embodiments, the PVD deposition process is performed using DC sputtering of a W target with about 25-35 kW DC power while providing about 150 to 1250 W of AC bias to the substrate, for example using about 13.56 MHz RF frequency (although other frequencies of RF energy can be provided). A temperature of the substrate can be maintained between about 25 to 325 degrees Celsius. In some embodiments, the PVD W liner layer can be deposited to a thickness of about 50 to 100 angstroms. In some embodiments, the PVD W liner layer 312 is also deposited along sidewalls of the feature 306 (e.g., the one or more sidewalls of the feature 306 formed through the second layer 302). In some embodiments, blocks 202 and 204 may be repeated a number of times to build up the treated PVD W liner layer 312 to a desired thickness. The treatment performed at block 202 modifies the PVD W microstructure of the PVD W liner layer 312 (as compared to PVD W deposition upon an untreated layer) to advantageously reduce PVD W liner resistivity, which in turn can advantageously reduce (i.e., improve) contact resistance (Rc) in a contact feature being fabricated. The treatment performed at block 202 can further advantageously improve gapfill performance by reducing CVD W incubation delay in a subsequent CVD deposition atop the bottom of the PVD W liner layer, thus reducing or eliminating voids in the filled feature.

Next, at block 206 and as depicted in FIG. 3C, a CVD W fill layer 314 is deposited atop the PVD W liner layer 312. The CVD W fill layer 314 can be deposited using known techniques for CVD deposition of W. In some embodiments, the CVD deposition process is performed using $WF_6$ and $H_2$ provided at a chamber pressure of about 90 to 300 Torr. A temperature of the substrate can be maintained between about 300 to 400 degrees Celsius. In some embodiments, the $WF_6$ can be provided at a flow rate of about 200 to 600 sccm and the $H_2$ can be provided at a flow rate of about 2 to 10 slm. The surface treatment performed at block 202 before the PVD W liner deposition at block 204 is used to modulate the PVD W microstructure and enhance the subsequent CVD growth at block 206. The inventors have observed that the foregoing process can provide a low resistance W fill with no bottom voids at the interface 316 of the PVD W and CVD W layers.

Figure 4:
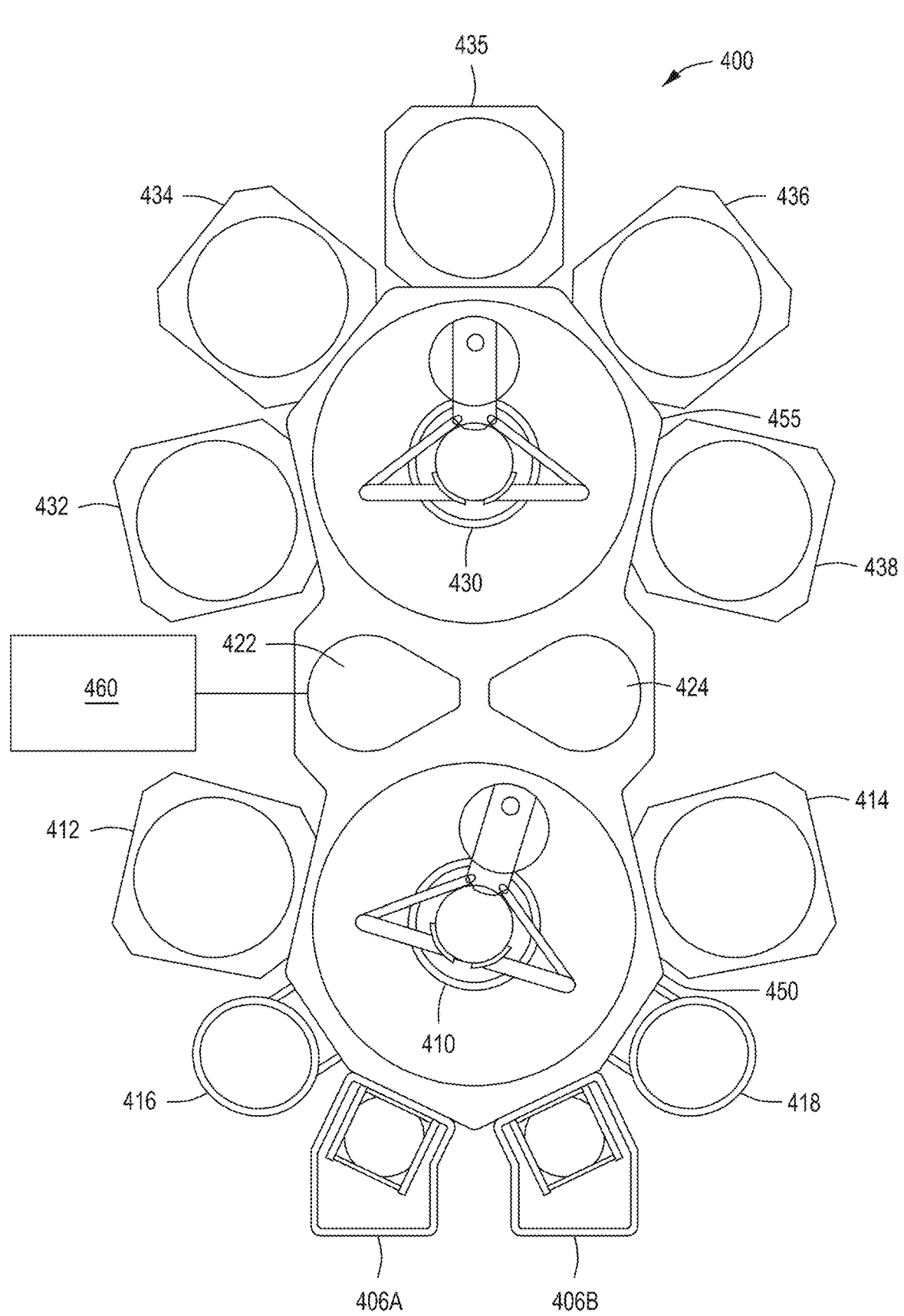
FIG. 4 depicts a cluster tool suitable to perform methods for processing a substrate in accordance with some embodiments of the present disclosure.

The methods described herein may be performed in individual process chambers that may be provided in a standalone configuration or as part of one or more cluster tools, for example, an integrated tool 400 (i.e., cluster tool) described below with respect to FIG. 4. In embodiments, a cluster tool is configured for performing the methods for processing a substrate as described herein. Examples of the integrated tool 400 include the CENTURA® and ENDURA® integrated tools, available from Applied Materials, Inc., of Santa Clara, CA. However, the methods described herein may be practiced using other cluster tools having suitable process chambers coupled thereto, or in other suitable process chambers in a non-clustered configuration. For example, in some embodiments the inventive methods discussed above may advantageously be performed in an integrated tool such that there are limited or no vacuum breaks while processing.

In embodiments, the integrated tool 400 can include two load lock chambers 406A, 406B for transferring of substrates into and out of the integrated tool 400. Typically, since the integrated tool 400 is under vacuum, the load lock chambers 406A, 406B may alternately "pump down" the interior volume to vacuum when substrates are introduced into the integrated tool 400 or raise the load lock interior volume pressure when substrates are to be removed from the integrated tool 400. A first robot 410 may transfer the substrates between the load lock chambers 406A, 406B, and a first set of one or more substrate processing chambers 412, 414, 416, 418 (four are shown) coupled to a first central transfer chamber 450. Each substrate processing chamber 412, 414, 416, 418, can be outfitted to perform one or a number of substrate processing operations.

In some embodiments, the first robot 410 can also transfer substrates to/from two intermediate transfer chambers 422, 424. The intermediate transfer chambers 422, 424 can be used to maintain ultrahigh vacuum conditions while allowing substrates to be transferred within the integrated tool 400. A second robot 430 can transfer the substrates between the intermediate transfer chambers 422, 424 and a second set of one or more substrate processing chambers 432, 434, 435, 436, 438 coupled to a second central transfer chamber 455. The substrate processing chambers 432, 434, 435, 436, 438 can be outfitted to perform a variety of substrate processing operations including the method 200 described above in addition to orientation and other substrate processes. Any of the substrate processing chambers 412, 414, 416, 418, 432, 434, 435, 436, 438 may be removed from the integrated tool 400 if not necessary for a particular process to be performed by the integrated tool 400.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

For example, a system controller 460 can control the operation of the integrated tool 400 using a direct control of the substrate processing chambers or alternatively, by controlling the computers (or controllers) associated with the substrate processing chambers and the integrated tool 400. In operation, the system controller 460 enables data collection and feedback from the respective substrate processing chambers and systems to optimize performance of the integrated tool 400. The system controller 460 generally includes a central processing unit (CPU), a memory, and support circuits. The CPU may be any form of a general-purpose computer processor that can be used in an industrial setting. The support circuits are conventionally coupled to the CPU and may comprise a cache, clock circuits, input/output subsystems, power supplies, and the like. Software routines, such as processing methods as described above may be stored in the memory (e.g., non-transitory computer readable storage medium) and, when executed by the CPU, transform the CPU into a specific purpose computer (system controller 460). The software routines may also be stored and/or executed by a second controller (not shown) that is located remotely from the integrated tool 400.

While the foregoing is directed to embodiments of the present principles, other and further embodiments of the principles may be devised without departing from the basic scope thereof.

The invention claimed is:

1. A method for forming tungsten gap fill in a feature, comprising:

treating a first metal gate layer on a substrate having a portion of the first metal gate layer exposed through the feature consisting essentially of CCTBA soak process; followed by depositing a tungsten liner layer directly atop the treated first metal gate layer in the feature using a physical vapor deposition (PVD) process to produce a PVD tungsten liner layer; and followed by:

depositing a tungsten fill layer into the feature and atop the PVD tungsten liner layer using a chemical vapor deposition (CVD) process;

wherein the CCTBA soak process consists of a single treatment of providing CCTBA in argon carrier gas at a flow rate of about 200 to 600 sccm, at a substrate temperature of about 175 to 225 degrees Celsius, a chamber pressure of about 1 to 50 Torr, and at a CCTBA concentration of about 1 to 10 atomic percent in the argon carrier gas, for about 5 to 30 seconds; and wherein the treating of the first metal gate layer is sufficient to modify a microstructure of the PVD tungsten liner layer to have a lower resistivity compared to a PVD W liner layer deposited upon an untreated first metal gate layer.

2. The method of claim 1, wherein the feature is formed through a second layer disposed atop the first metal gate layer and exposing the portion of the first metal gate layer is through a bottom of the feature.

3. The method of claim 2, wherein the second layer is an insulating layer.

4. The method of claim 3, wherein the insulating layer is a $SiO_2$ layer.

5. The method of claim 3, wherein the first metal gate layer is a TiN layer.

* * * * *